US006593784B1

(12) United States Patent
Gauthier et al.

(10) Patent No.: US 6,593,784 B1
(45) Date of Patent: Jul. 15, 2003

(54) POST-SILICON BIAS-GENERATOR CONTROL FOR A DIFFERENTIAL PHASE LOCKED LOOP

(75) Inventors: Claude Gauthier, Fremont, CA (US); Brian Amick, Austin, TX (US); Pradeep Trivedi, Sunnyvale, CA (US); Dean Liu, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/131,299

(22) Filed: Apr. 24, 2002

(51) Int. Cl.$^7$ ................................................ H03L 7/06
(52) U.S. Cl. ........................ 327/156; 327/159; 331/34; 331/40
(58) Field of Search ................................ 327/156, 158, 327/108, 112; 331/34, 40, 41, 42, 43, 17; 326/82, 85, 57

(56) References Cited

U.S. PATENT DOCUMENTS

| | | | | |
|---|---|---|---|---|
| 5,257,294 A | * | 10/1993 | Pinto et al. | 375/120 |
| 5,631,587 A | * | 5/1997 | Co et al. | 327/107 |
| 5,870,003 A | * | 2/1999 | Boerstler | 331/17 |
| 5,978,425 A | * | 11/1999 | Takla | 375/374 |
| 6,137,368 A | * | 10/2000 | Cho | 331/16 |

OTHER PUBLICATIONS

"Low–Jitter Process–Independent DLL and PLL Based on Self–Biased Techniques" Author: John G. Maneatis As published in: "IEEE Journal of Solid–State Circuits" vol. 31, No. 11, Nov., 1996 (10 pages).

"Jitter Optimization Based on Phase–Locked Loop Design Parameters" Authors: Mozhgan Mansuri, Chih–Kong Ken Yang of the University of California, Los Angeles, CA As published in: "2002 Digest of Technical Papers" vol. 45, ISSN 0193–6530 at 2002 IEEE International Solid States Circuits Conference, Feb. 3–7, 2002 (3 pages).

* cited by examiner

Primary Examiner—Timothy P. Callahan
Assistant Examiner—An T. Luu
(74) Attorney, Agent, or Firm—Rosenthal & Osha L.L.P.

(57) ABSTRACT

A technique for adjusting a bias-generator in a phase locked loop after fabrication of the phase locked loop is provided. The technique involves use of an adjustment circuit operatively connected to the bias-generator, where the adjustment circuit is controllable to facilitate a modification of a voltage output by the bias-generator. Such control of the voltage output by the bias-generator allows a designer to achieve a desired phase locked loop performance characteristic after the phase locked loop has been fabricated.

22 Claims, 5 Drawing Sheets

POST-SILICON BIAS-GENERATOR CONTROL FOR A DIFFERENTIAL PHASE LOCKED LOOP

BACKGROUND OF INVENTION

Figure 1:
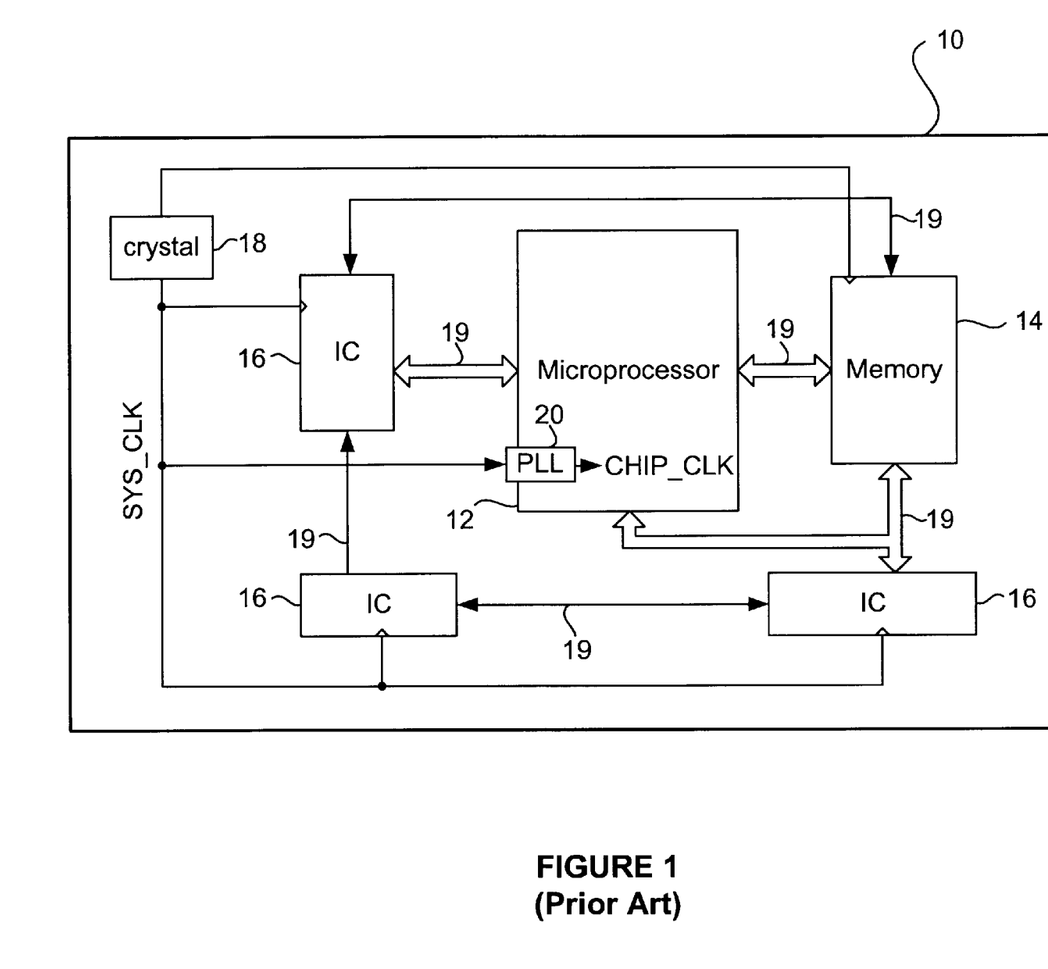
FIG. 1 shows a typical computer system.

As shown in FIG. 1, a typical computer system (10) has, among other components, a microprocessor (12), one or more forms of memory (14), integrated circuits (16) having specific functionalities, and peripheral computer resources (not shown), e.g., monitor, keyboard, software programs, etc. These components communicate with one another via communication paths (19), e.g., wires, buses, etc., to accomplish the various tasks of the computer system (10).

In order to properly accomplish such tasks, the computer system (10) relies on the basis of time to coordinate its various operations. To that end, a crystal oscillator (18) generates a system clock signal (referred to and known in the art as "reference clock" and shown in FIG. 1 as SYS_CLK) to various parts of the computer system (10). Modern microprocessors and other integrated circuits, however, are typically capable of operating at frequencies significantly higher than the system clock, and thus, it becomes important to ensure that operations involving the microprocessor (12) and the other components of the computer system (10) use a proper and accurate reference of time.

One component used within the computer system (10) to ensure a proper reference of time among a system clock and a microprocessor clock, i.e., "chip clock," is a type of clock generator known as a phase locked loop, or "PLL" (20). The PLL (20) is an electronic circuit that controls an oscillator such that the oscillator maintains a constant phase relative to a system signal. Referring to FIG. 1, the PLL (20) has as its input the system clock, which is its reference signal, and outputs a chip clock signal (shown in FIG. 1 as CHIP_CLK) to the microprocessor (12). The system clock and chip clock have a specific phase and frequency relationship controlled by the PLL (20). This relationship between the phases and frequencies of the system clock and chip clock ensures that the various components within the microprocessor (12) use a controlled and accounted for reference of time. When this relationship is not maintained by the PLL (20), however, the operations within the computer system (10) become non-deterministic.

Figure 2:
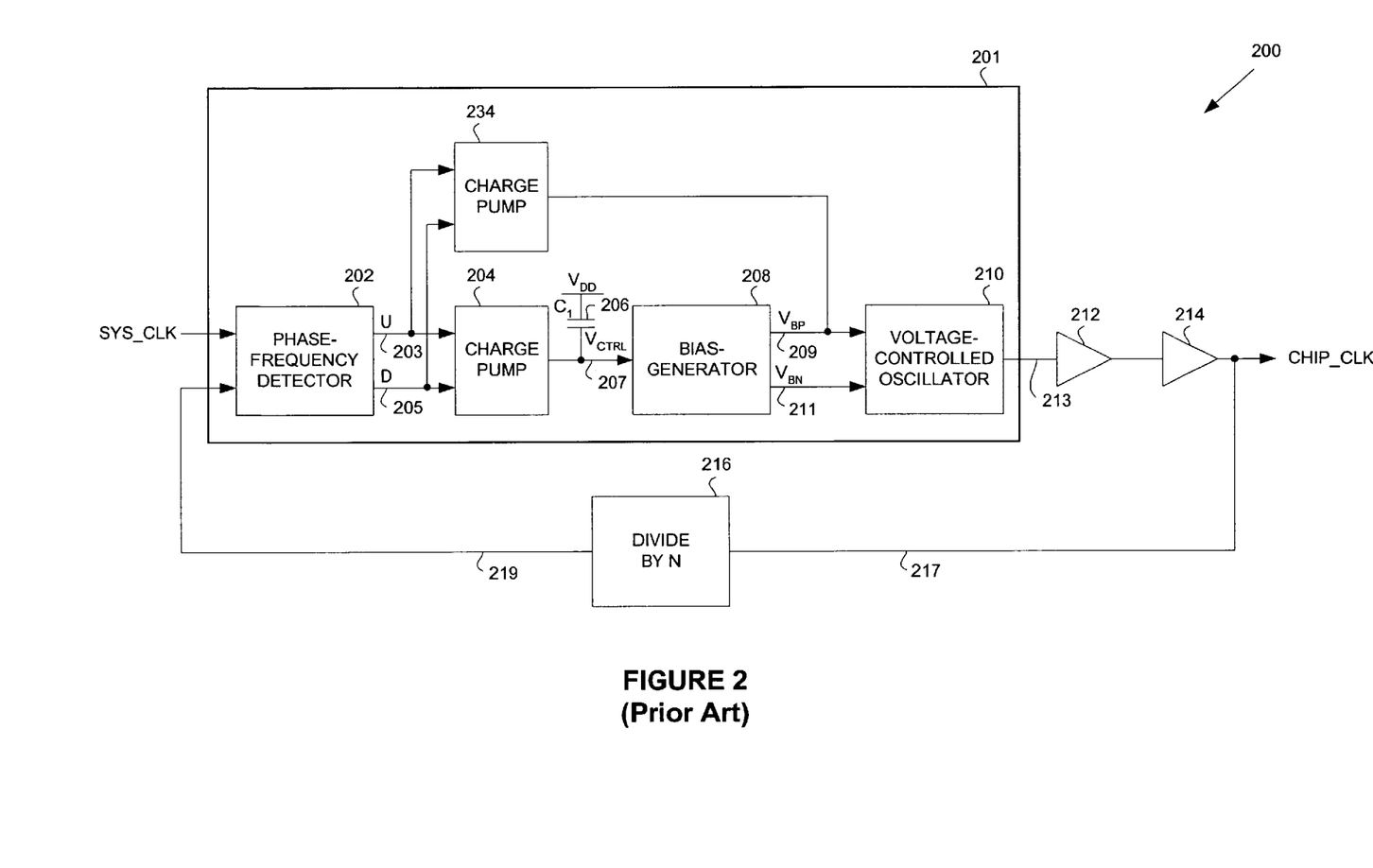
FIG. 2 shows a prior art phase locked loop block diagram.

FIG. 2 shows a representative PLL (200). The representative PLL (200) includes a PLL core (201), buffers (212, 214), a feedback loop and a divide by N block (216). The PLL core (201) aligns the transition edge and frequency of the system clock (SYS_CLK) and a feedback loop signal (219). The PLL core (201) adjusts its output frequency in order to zero any phase and frequency difference between the system clock (SYS_CLK) and the feedback loop signal (219). The addition of the divide by N block (216) in the feedback loop enables the PLL core (201) to multiply the system clock (SYS_CLK). Multiplying the system clock is useful when the chip clock (CHIP_CLK) must have a higher frequency than the system clock (SYS_CLK). By adding the divide by N block (216), the chip clock (CHIP_CLK) frequency should be N times faster to allow the phase and frequency difference between the system clock (SYS_CLK) and the feedback loop signal (219) to zero. The representative PLL (200) may also have buffers (212, 214) to drive a larger resistive and/or capacitive load. The buffers (212, 214) are in the feedback loop so that the delay created by the buffers (212, 214) is zeroed by the PLL core (201).

The PLL core (201) adjusts the phase and frequency difference between the system clock (SYS_CLK) and the feedback loop signal (219). System clock (SYS_CLK) and the feedback loop signal (219) are used as inputs to a phase-frequency detector (202). The phase-frequency detector (202) measures whether the phase and frequency difference between the system clock and the feedback loop signal (219) are correct. An adjustment in the phase or frequency produces signals that control a charge pump (204) and a charge pump (234). The phase-frequency detector (202) indicates that the charge pumps (204, 234) should increase or decrease its output using control signals up, U (203), and down, D (205). The charge pump (204) adds or removes charge from a capacitor, $C_1$ (206), that changes the DC value at the input of a bias-generator (208). The capacitor, $C_1$ (206), is connected between a power supply, $V_{DD}$, and an input voltage, $V_{CRTL}$ (207). The charge pump (204) adds or removes charge from an output, $V_{BP}$ (209), of a bias-generator (208).

The bias-generator (208) produces control voltages, $V_{BP}$ (209) and $V_{BN}$ (211), in response to the input voltage, $V_{CTRL}$ (207). The PLL core (201) may be self-biased by adding the charge pump (234) to the bias-generator (208) output, $V_{BP}$ (209). The addition of a second charge pump (234) allows the removal of a resistor in series with the capacitor $C_1$ (206). A voltage-controlled oscillator (210) produces an output that has a frequency related to the control voltages, $V_{BP}$ (209) and $V_{BN}$ (211). The output (213) from the voltage-controlled oscillator, after being buffered by the buffers (212, 214), provides a frequency, N times as fast as the system clock (SYS_CLK), to other circuits. Ideally, the chip clock (CHIP_CLK) output is a constant multiple by N of the system clock (SYS_CLK) input. The chip clock (CHIP_CLK), however, is affected by power supply noise.

One common performance measure for a PLL is jitter. Jitter is the time domain error from poor spectral purity of an output. In other words, in a repeated output pattern, such as a clock signal, a transition that occurs from one state to another does not happen at the same time relative to other transitions. Jitter represents the perturbations that result in the intermittent shortening or lengthening of signal elements of an output. The system clock may have jitter that may need to be filtered by the PLL. The PLL may need to follow and compensate for jitter at the PLL output.

Phase locked loops are basically second order feedback control systems. As such, the phase locked loop can be described in the frequency domain as having a damping factor and natural frequency. The damping factor and natural frequency are fixed by the selection of the PLL circuit parameters. The loop bandwidth is defined as the PLL input frequency at which the PLL output magnitude is 3 dB lower than the PLL output magnitude when the PLL input frequency is zero (DC). The loop bandwidth determines to a large degree the speed at which the phase locked loop can react to a disturbance. The PLL should have a low loop bandwidth so that input clock jitter is filtered. Power supply noise will, however, have a certain noise-versus-frequency characteristic. The PLL loop bandwidth may need to be increased to recover from the generation of output jitter caused by power supply noise.

SUMMARY OF INVENTION

According to one aspect of the present invention, an integrated circuit including a clock path for carrying a clock signal; a power supply path adapted to receive power from a power supply; a phase locked loop connected to the power supply path including a voltage-controlled oscillator for generating a frequency signal dependent on an input thereto, a phase-frequency detector for detecting a phase difference between the clock signal and the frequency signal, and a bias-generator arranged to output a voltage to the input of the voltage-controlled oscillator responsive to the phase-frequency detector; and an adjustment circuit operatively connected to the input of the voltage-controlled oscillator where the adjustment circuit modifies the voltage output by the bias-generator.

According to one aspect of the present invention, a phase locked loop including a voltage-controlled oscillator for generating a frequency signal dependent on an input thereto, a phase-frequency detector for detecting a phase difference between a clock signal and the frequency signal, a bias-generator arranged to output a voltage to the input of the voltage-controlled oscillator responsive to the phase-frequency detector, and an adjustment circuit operatively connected to the input of the voltage-controlled oscillator where the adjustment circuit modifies the voltage output by the bias-generator.

According to one aspect of the present invention, a method for modifying an operating characteristic of a phase locked loop including generating a frequency signal, comparing the frequency signal to a clock signal, adjusting the generating based on the comparing using a bias-generator, generating a binary control word, adjusting an output of the bias-generator in the phase locked loop dependent on the binary control word, and operating the phase locked loop where the adjusting the output of the bias-generator modifies an operating characteristic of the phase locked loop.

Other aspects and advantages of the invention will be apparent from the following description and the appended claims.

DETAILED DESCRIPTION

Embodiments of the present invention relate to an integrated circuit having a phase locked loop, the phase locked loop including a bias-generator, voltage-controlled oscillator, and an adjustment circuit. The output of the bias-generator is arranged to provide a voltage to the input of the voltage-controlled oscillator. The adjustment circuit is operatively connected to an input of the voltage-controlled oscillator to modify the voltage that is output by the bias-generator. Embodiments of the present invention relate to a method for modifying an operating characteristic of a phase locked loop.

Embodiments of the present invention relate to an adjustment circuit that has a wired-OR connection to an output of the bias-generator. The adjustment circuit may change the voltage produced on the output of the bias-generator. The change in voltage produced on the output of the bias-generator adjusts the voltage to the input of the voltage-controlled oscillator. The adjustment circuit allows modification of the output of the bias-generator, and consequently modifies an operating characteristic of the phase locked loop.

In FIG. 2, the frequency response of the representative PLL (200) may be analyzed with a Laplace transform approximation, where the sample operation of the phase-frequency detector is ignored. This, approximation is useful for loop bandwidths about a decade or more below the operating frequency of the PLL. This loop bandwidth constraint is also required for stability due to the reduced phase margin near the higher order poles that result from the delay around the sampled feedback loop. The charge pumps (204, 234) adds or removes charge to its output depending on the state of input control signals, typically up, U (203), or down, D (205), pulses. Both pulses may be "on" at the same time, however, if the up or the down pulse remains "on" longer than the other, the net charge at the output of the charge pumps (204, 234) increase or decrease.

The charge pump gain may be modeled as a linear gain versus phase error. The phase error is the output of the phase-frequency detector (202). The Laplace transform of the output of the charge pump (204), $I_{OUT}$, versus the input to the charge pump from the phase-frequency detector (202), (i.e., phase error), $\Phi_E(s)$, is $I_{OUT}(s)/\Phi_E(s)=I_{CP}/2\pi$, where $I_{CP}$ is the current generated by the charge pump (204).

For modeling purposes, the charge pump (234) may be replaced by a resistor, R, in series with the capacitor $C_1$ (206). A loop filter may include the capacitor, $C_1$ (206), and series resistor R (not shown) connected from $I_{OUT}$ to $V_{DD}$. The loop filter transforms the output of the charge pump, $I_{OUT}$, into the bias-generator input voltage, $V_{CTRL}$. The Laplace transform of the series resistor and capacitor in the loop filter is $V_{CTRL}(s)/I_{OUT}(s)=(sRC_1+1)/(sC_1)$. The transfer function of the capacitor and resistor shows that a zero is added that adds stability to the PLL feedback loop. The bias-generator (208) produces control voltages, $V_{BP}$ (209) and $V_{BN}$ (211), in response to the input voltage, $V_{CTRL}$ (207). The net effect of the control voltages, $V_{BP}$ (209) and $V_{BN}$ (211), is produced by a bias-generator gain, $K_{BG}$, multiplied by $V_{CTRL}$. The bias-generator gain, $K_{BG}$, is typically equal to one. Any deviation from the ideal value of one may need to be corrected.

The voltage-controlled oscillator (210) outputs a clock that has a frequency proportional to the net effect of the control voltages, $V_{BP}$ (209) and $V_{BN}$ (211). The Laplace transform of the voltage-controlled oscillator (210) from the bias-generator input voltage, $V_{CTRL}$, is $\Phi_{OUT}(s)/V_{CTRL}(s)=K_{BG}K_{VCO}/s$.

The closed-loop transfer function can now be derived as $H(s)=\Phi_{OUT}(s)/\Phi_{IN}(s)=[(R\ K_{BG}\ K_{VCO}\ I_{CP}/2\pi)/(s+1/R\ C_1)]/[s^2+s\ R\ C_1\ K_{BG}\ K_{VCO}\ I_{CP}/2\pi\ N\ C+K_{VCO}\ I_{CP}/2\pi\ N\ C]$. $H(s)$ is a second order system that has one pole from the loop filter and one pole from the voltage-controlled oscillator (210), and one zero from the resistor, R, in the loop filter. The transfer function $H(s)$ has a natural frequency $\omega_n=(K_{BG}\ K_{VCO}\ I_{CP}/2\pi\ N\ C_1)^{0.5}$ and a damping factor $\zeta=R\ C_1\ \omega_n/2$.

The loop bandwidth is defined as the frequency at which the output magnitude is 3 dB lower than when the input is DC. Loop bandwidth is not the same as natural frequency, although they are often close. Low loop bandwidth allows the PLL to filter input jitter. High loop bandwidth allows the PLL to follow and compensate for output jitter induced by power supply noise. A design tradeoff must be made in the loop bandwidth of the PLL. Optimizing the PLL loop bandwidth relates to balancing the effect of input jitter with the response speed of the PLL loop to compensate for output jitter induced by power supply noise.

Those with ordinary skill in the art will appreciate that the ability to adjust the loop bandwidth after the PLL is manufactured is advantageous. Design and simulation of the PLL may show the desired characteristics. After manufacture of the PLL, the characteristics of the manufactured PLL may not be the same as the characteristics of the simulated PLL. The ability to investigate the effects of adjusting the PLL after manufacture is desirable.

Figure 3:
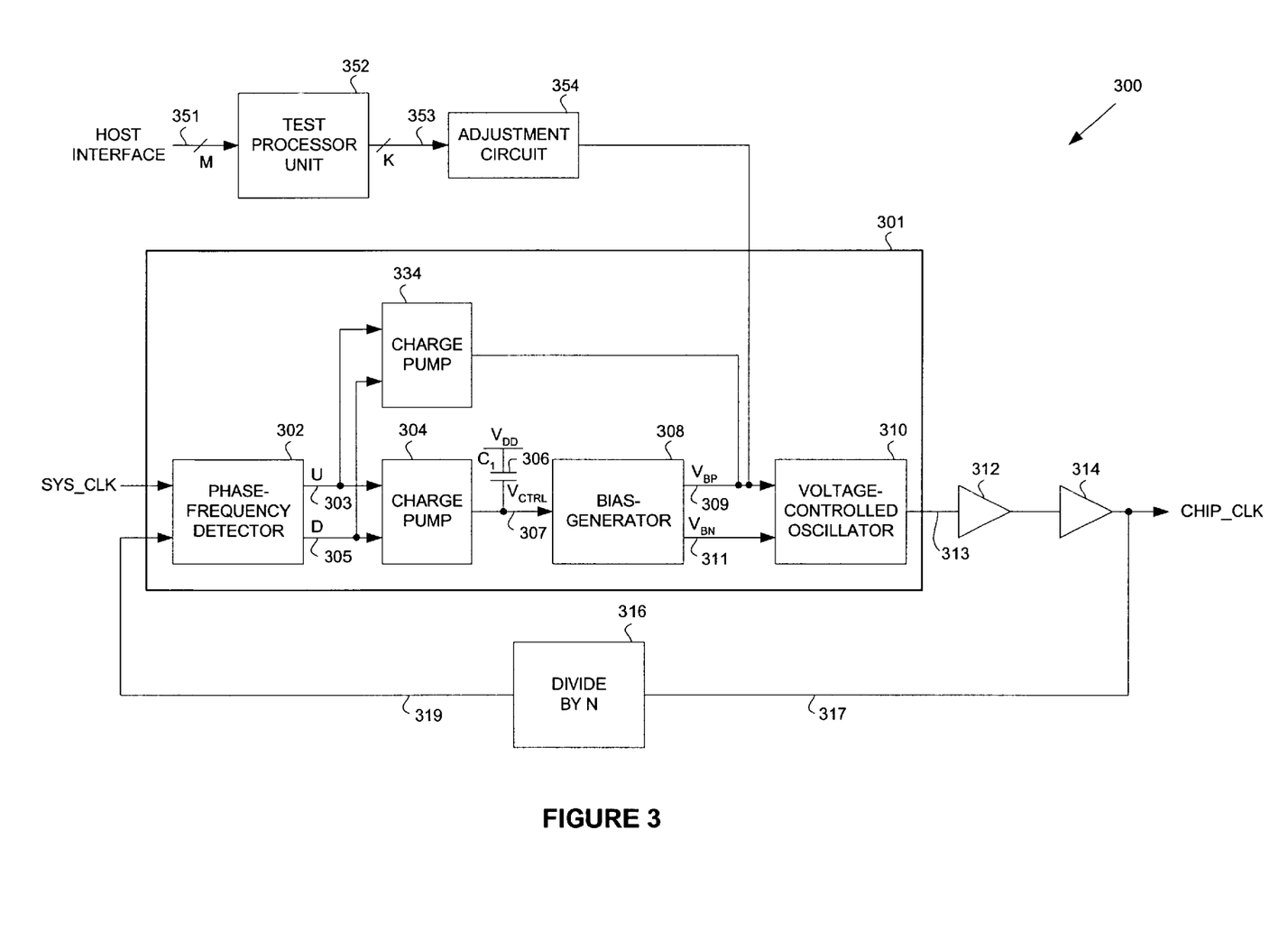
FIG. 3 shows a phase locked loop block diagram in accordance with an embodiment of the present invention.

FIG. 3 shows an adjustable PLL (300) in accordance with an embodiment of the present invention. In FIG. 3, the adjustable PLL (300) may include a PLL core (301), buffers (312, 314), and feedback loop with a divide by N block (316) in the feedback loop. An adjustment circuit (354) controlled by a test processor unit (352) are added in accordance withan embodiment of the present invention. The adjustment circuit (354) may be the same as adjustment circuit (400) shown in FIG. 4. The phase-frequency detector (302), charge pumps (304, 334), capacitor $C_1$ (306), bias-generator (308) and voltage-controlled oscillator (310) of the adjustable PLL (300) may operate similarly to the representative PLL (200 in FIG. 2) as previously described.

In FIG. 3, the test processor unit (352) generates a binary control word from registers that determines the settings of the adjustment circuit (354). The test processor unit (352) may change the contents of its registers through a host interface. The host interface may communicate with the test processor unit (352) using M communication lines (351). Those with ordinary skill in the art will appreciate that the host interface and M communication lines (351) may take a wide variety of forms. The host interface may be operatively connected to a separate computer system. The communication may be defined by an industry standard.

The output of the adjustment circuit (354) is connected to the control voltage, $V_{BP}$ (309), using a wired-OR connection The control voltage, $V_{BP}$ (309), is generated as an output from the bias-generator (308) and enabled as a self-biased output by the charge pump (334). Depending on the binary control word maintained by the registers of the test processor unit (352), multiple control signals K (353) adjust the output of the adjustment circuit (354). An adjustment on control voltage $V_{BP}$ (309) may modify an operating characteristic of the adjustable PLL (300). For example, the loop bandwidth of the adjustable PLL (300) may be adjusted to increase or decrease; therefore, the speed of response to jitter may be increased or decreased, respectively. Furthermore, process or manufacturing variations may create an offset in the control voltage, $V_{BP}$ (309), from a desired nominal operating value. The adjustment circuit (354) may adjust the voltage of the output from the bias-generator (308), or equally the input to the voltage-controlled oscillator (310), to correct the offset.

One with ordinary skill in the art will appreciate that even though the adjustment circuit (354) may be connected to the control voltage, $V_{BP}$ (309), of the bias-generator (308), the adjustment circuit (354) may be turned "off." The adjustment circuit (354) may not have an effect on the adjustable PLL (300).

Those skilled in the art will appreciate that the adjustable PLL (300) may be analog, digital, or a combination of both types of circuits.

Figure 4:
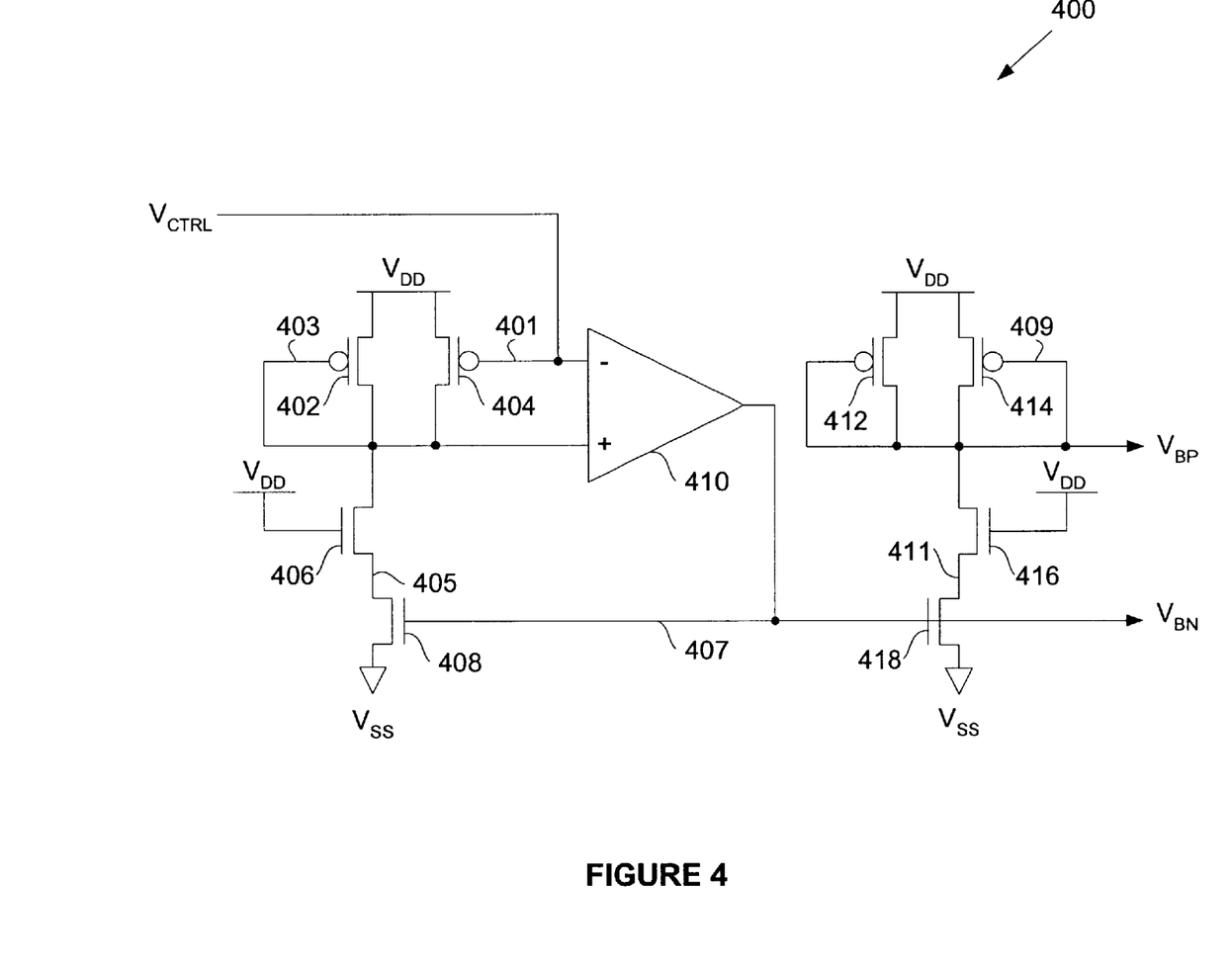
FIG. 4 shows a bias-generator circuit in accordance with an embodiment of the present invention.

FIG. 4 shows a bias-generator circuit (400) in accordance with an embodiment of the present invention. The input voltage, $V_{CTRL}$ (307), in FIG. 3 is the input to the bias-generator circuit (400). The bias-generator (400) produces control voltages, $V_{BP}$ (409) and $V_{BN}$ (407), in responseto the input voltage, $V_{CTRL}$ (401). The input voltage, $V_{CTRL}$ (401), is input to a comparator (410) and the gate of a p-channel transistor (404). P-channel transistors (402, 404) form a differential pair where p-channel transistor (402) is diode connected using signal (403). Signal (403) is also connected to the comparator (410). The comparator (410) adjusts its output, control voltage $V_{BN}$ (407), to create a zero voltage difference between input voltage, $V_{CTRL}$ (401), and signal (403).

The control voltage $V_{BN}$ (407) adjusts the current flow through n-channel transistors (408, 418). N-channel transistors (406, 416) provides resistive elements, as their gates are connected to $V_{DD}$. P-channel transistors (412, 414) form another differential pair where p-channel transistors (412, 414) are both diode connected using control voltage, $V_{BP}$ (409). The control voltage, $V_{BP}$ (409), may have a nominal voltage similar in value to the input voltage, $V_{CTRL}$ (401). Due to process variations during manufacture or simulation modeling different from the physical transistors, the control voltage, $V_{BP}$ (409), may not have a similar voltage value, i.e., offset, to the input voltage, $V_{CTRL}$ (401). The adjustment circuit (500) in FIG. 5 provides a means to correct the offset.

Those skilled in the art will appreciate that the bias-generator circuit (400) shows a circuit arrangement in which the control voltage, $V_{BP}$ (409), may have a nominal voltage similar in value to the input voltage, $V_{CTRL}$ (401). A bias-generator may also be designed such that the control voltage, $V_{BN}$ (407), may have a nominal voltage similar in value to the input voltage, $V_{CTRL}$ (401). In this arrangement, the control voltage, $V_{BP}$ (409), may be representative of a voltage necessary to create a zero voltage difference between two inputs to a comparator. In this arrangement, the adjustment circuit (354) in FIG. 3 may have its output connected to the control voltage, $V_{BN}$ (407), in FIG. 4, instead of the control voltage, $V_{BP}$ (409). The ability to adjust the adjustable PLL (300) in FIG. 3 with this arrangement is expected to be similar to the ability to adjust the adjustable PLL (300) in FIG. 3 using the bias-generator circuit (400) shown in FIG. 4.

Figure 5:
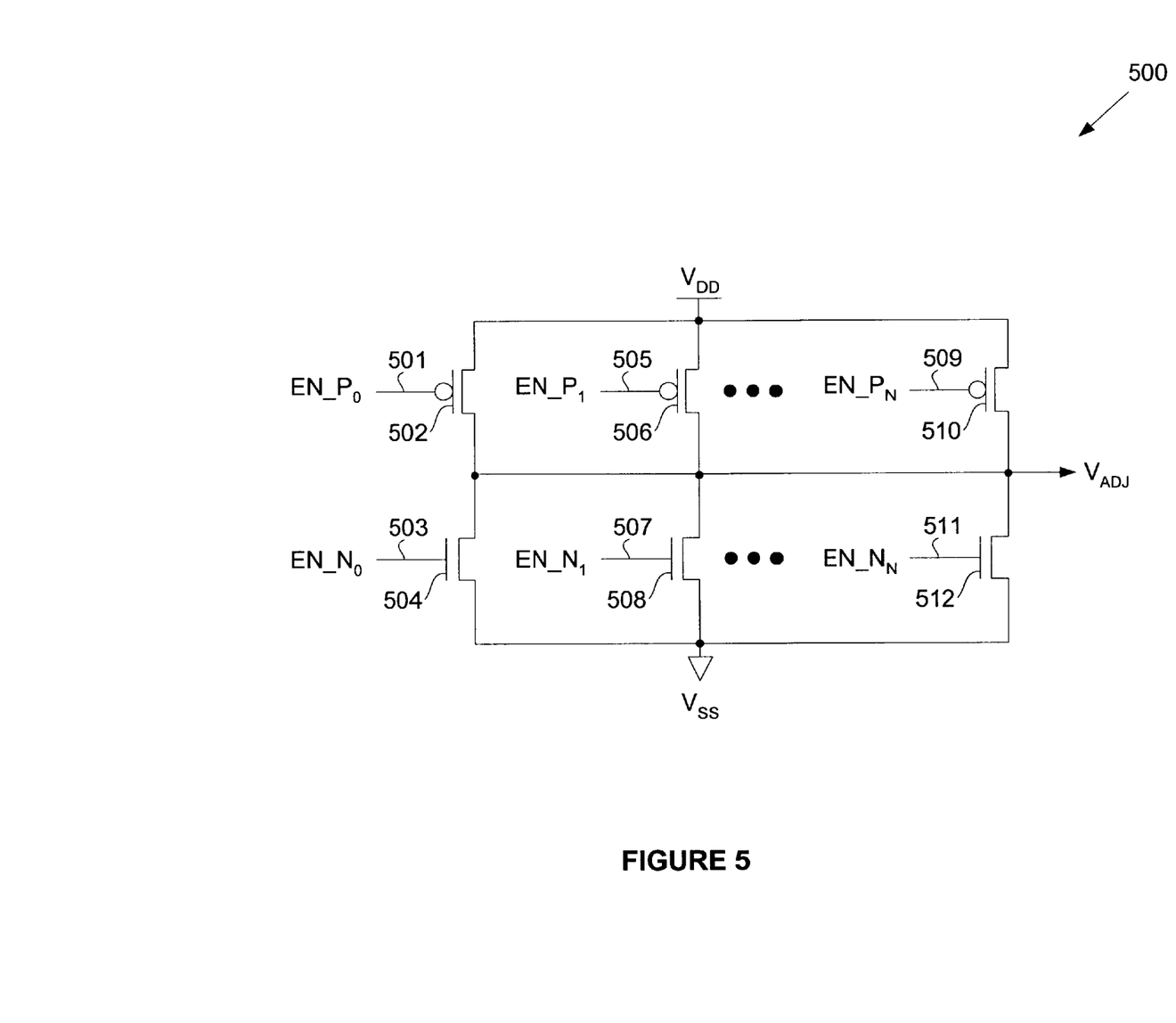
FIG. 5 shows an adjustment circuit in accordance with an embodiment of the present invention.

In FIG. 5, an adjustment circuit (500) in accordance with an embodiment of the present invention is shown.. The adjustment circuit may include multiple p-channel transistors (502, 506, 510) arranged in parallel with each other. The multiple p-channel transistors (502, 506, 510) connect between the power supply $V_{DD}$ and a common node, $V_{ADJ}$. The adjustment circuit also includes multiple n-channel transistors (504, 508, 512) arranged in parallel with each other. The multiple n-channel transistors (504, 508, 512) connect between ground, $V_{SS}$, and a common node, $V_{ADJ}$.

Each transistor may have an individual control signal to turn "on" or "off" one or more of the p-channel transistors (502, 506, 510) or n-channel transistors (504, 508, 512). The p-channel transistors (502, 506, 510) have control signals EN_$P_0$ (501), EN_$P_1$ (505), and EN_$P_N$ (509) connected to their gates, respectively. The n-channel transistors (504, 508, 512) have control signals EN_$N_0$ (503), EN_$N_1$ (507), and EN_$N_N$ (511) connected to their gates, respectively. A low voltage on any of the EN_$P_X$ signals (501, 505, 509) will turn "on" their respective p-channel transistors (502, 506, 510). A high voltage on any of the EN_$N_X$ signals (503, 507, 511) will turn. "on" their respective n-channel transistors (504, 508, 512).

Any p-channel transistor (502, 506, 510) that is "on" will have a tendency to increase the voltage on $V_{ADJ}$ toward $V_{DD}$. Any n-channel transistor (504, 508, 512) that is "on" will have a tendency to decrease the voltage on $V_{ADJ}$ toward $V_{SS}$. By selecting which p-channel transistors (502, 506, 510) and/or n-channel transistors (504, 508, 512) are 'on', a change in the voltage on $V_{ADJ}$ may be achieved.

Those with ordinary skill in the art will appreciate that the p-channel transistors (502, 506, 510) and n-channel transistors (504, 508, 512) may be turned "on" individually or as a group. The p-channel transistors (502, 506, 510) and n-channel transistors (504, 508, 512) may be sized so that each transistor has a different effect compared to the other transistors, specifically the transistor's gate width may be varied to adjust the strength of each transistor. The gate widths may be designed to provide a linear, exponential, or other function as more transistors are turn "on."

The p-channel transistors (502, 506, 510) and n-channel transistors (504, 508, 512) may be sized so that each transistor has an inherently resistive nature, specifically the transistor gate lengths may be increased (i.e., long channel transistors) to increase the inherent resistance of each transistor. A larger inherent resistance may be advantageous if both a p-channel transistor and a n-channel transistor are "on" simultaneously. The adjustment circuit (500) may include only one p-channel transistor, e.g., p-channel transistor (502), and one n-channel transistor, e.g., n-channel transistor (504), connected in series.

The multiple control signals K (353) in FIG. 3 may represent EN_$N_X$ signals (503, 507, 511) in FIG. 5 and EN_$P_X$ signals (501, 505, 509) in FIG. 5. The multiple control signals K (353) in FIG. 3 may turn "on" or "off" the p-channel transistors (502, 506, 510) in FIG. 5 and n-channel transistors (504, 508, 512) in FIG. 5 in the adjustment circuit (354) in FIG. 3. The common node, $V_{ADJ}$ (FIG. 5), of the adjustment circuit (354) in FIG. 3 may adjust the voltage on control voltage, $V_{BP}$ (309), in FIG. 3.

Advantages of the present invention may include one or more of the following. In some embodiments, because an adjustment, circuit may modify the operating characteristics of the adjustable PLL (300), an investigation of the adjustable PLL (300) response during operating conditions may be performed. The adjustable PLL (300), having been manufactured, demonstrates characteristics that may not have been apparent from simulation. Realistic results help determine appropriate values for circuit elements within the adjustable PLL (300) and help alleviate costly over design.

In some embodiments, because the adjustable PLL (300) may be manufactured with a means for adjusting the output of the bias-generator, fewer design iterations and higher confidence in the adjustable PLL (300) operating characteristics may be afforded. Likewise, the adjustable PLL (300) response to various system disturbances such as power supply noise and system clock jitter may be realistically determined. The adjustable PLL (300) may help determine the proper values and sizes for the circuits in the bias-generator (400) in FIG. 4 and/or charge pump (334) in FIG. 3. The adjustment circuit (500) may help resolve any offset between the input voltage, $V_{CTRL}$ (307) in FIG. 3, and the control voltage, $V_{BP}$ (309) in FIG. 3.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit, comprising:
    a clock path for carrying a clock signal;
    a power supply path adapted to receive power from a power supply;
    a phase locked loop connected to the power supply path, comprising:
        a voltage-controlled oscillator for generating a frequency signal dependent on an input thereto;
        a phase-frequency detector for detecting a phase difference between the clock signal and the frequency signal; and
        a bias-generator arranged to output a voltage to the input of the voltage-controlled oscillator responsive to the phase-frequency detector; and
        an adjustment circuit operatively connected to the input of the voltage-controlled oscillator, wherein the adjustment circuit modifies the voltage output by the bias-generator, and wherein the adjustment circuit comprises a first switch to provide current flow between a first voltage provided by the power supply path and the input of the voltage-controlled oscillator, and a second switch to provide current flow between a second voltage provided by the power supply path and the input of the voltage-controlled oscillator.

2. The integrated circuit of claim 1, wherein the adjustment circuit is connected to the output of the bias-generator with a wired-OR connection.

3. The integrated circuit of claim 1, wherein the adjustment circuit comprises a first p-channel transistor and a first n-channel transistor, wherein the first p-channel transistor and the first n-channel transistor are connected in series.

4. The integrated circuit of claim 3, the adjustment circuit further comprising:
    a second p-channel transistor connected in parallel with the first p-channel transistor; and
    a second n-channel transistor connected in parallel with the first n-channel transistor, wherein the first p-channel, transistor and second p-channel transistor are in series with the first n-channel transistor and second n-channel transistor.

5. The integrated circuit of claim 4, wherein the first p-channel transistor is a longer channel transistor than the second p-channel transistor.

6. The integrated circuit of claim 4, wherein the first n-channel transistor is a longer channel transistor than the second n-channel transistor.

7. The integrated circuit of claim 4, wherein the first p-channel transistor is a wider gate width transistor than the second p-channel transistor.

8. The integrated circuit of claim 4, wherein the first n-channel transistor is a wider gate width transistor than the second n-channel transistor.

9. The integrated circuit claim 1, further comprising:
    a test processor unit, wherein the test processor unit generates a binary control word.

10. The integrated circuit of claim 9, wherein the adjustment circuit is responsive to the binary control word.

11. An integrated circuit having a phase locked loop, the phase locked loop comprising:
    means for generating a frequency signal;
    means for comparing the frequency signal to a clock signal;
    means for adjusting the generating based on the comparing using a bias-generator;
    means for generating a binary control word;
    adjusting means for adjusting an output of the bias-generator in the phase locked loop dependent on the binary control word, wherein the adjusting means for adjusting the output of the bias-generator comprises means for controlling a first current flow between a first voltage and the output of the bias-generator, and means for controlling a second current flow between a second voltage and the output of the bias-generator; and means for operating the phase locked loop, wherein the adjusting means modifies an operating characteristic of the phase locked loop.

12. A phase locked loop comprising:

a voltage-controlled oscillator for generating a frequency signal dependent on an input thereto;

a phase-frequency detector for detecting a phase difference between a clock signal and the frequency signal;

a bias-generator arranged to output a voltage to the input of the voltage-controlled oscillator responsive to the phase-frequency detector; and an adjustment circuit operatively connected to the input of the voltage-controlled oscillator, wherein the adjustment circuit modifies the voltage output by the bias-generator, and wherein the adjustment circuit comprises a first switch to provide current flow between a first voltage and the input of the voltage-controlled oscillator, and a second switch to provide current flow between a second voltage and the input of the voltage-controlled oscillator.

13. A method for modifying an operating characteristic of a phase locked loop, comprising:

generating a frequency signal;

comparing the frequency signal to a clock signal;

adjusting the generating based on the comparing using a bias-generator;

generating a binary control word;

adjusting an output of the bias-generator in the phase locked loop dependent on the binary control word, wherein the adjusting the output of the bias-generator comprises controlling a first current flow between a first voltage and the output of the bias-generator, and controlling a second current flow between a second voltage and the output of the bias-generator; and operating the phase locked loop, wherein the adjusting the output of the bias-generator modifies an operating characteristic of the phase locked loop.

14. The method of claim 13, wherein the adjusting the output of the bias-generator is performed by an adjustment circuit, wherein the adjustment circuit comprises a first switch to provide current flow between a first voltage and the output of the bias-generator, and a second switch to provide current flow between a second voltage and the output of the bias-generator.

15. The method of claim 13, wherein the adjusting the output of the bias-generator is performed by an adjustment circuit, wherein the adjustment circuit comprises a first p-channel transistor and a first n-channel transistor, wherein the first p-channel transistor and the first n-channel transistor are connected in series.

16. The method of claim 15, wherein the adjustment circuit further comprising:

a second p-channel transistor connected in parallel with the first p-channel transistor; and a second n-channel transistor connected in parallel with the first n-channel transistor, wherein the first p-channel transistor and second p-channel transistor are in series with the first n-channel transistor and second n-channel transistor.

17. The method of claim 16, wherein the first p-channel transistor is a longer channel transistor than the second p-channel transistor.

18. The method of claim 16, wherein the first n-channel transistor is a longer channel transistor than the second n-channel transistor.

19. The method of claim 16, wherein the first p-channel transistor is a wider gate width transistor than the second p-channel transistor.

20. The method of claim 16, wherein the first n-channel transistor is a wider gate width transistor than the second n-channel transistor.

21. The method of claim 13, wherein the adjusting the output of the bias-generator is performed by an adjustment circuit connected to the output of the bias-generator with a wired-OR connection.

22. The method of claim 13, wherein generating the binary control word is performed by a test processor unit.

* * * * *